US011751687B2

(12) United States Patent
Cox et al.

(10) Patent No.: US 11,751,687 B2
(45) Date of Patent: Sep. 12, 2023

(54) SYSTEMS AND METHODS FOR AUTOMATED EQUIPMENT CABINET LEVELING

(71) Applicant: JPMORGAN CHASE BANK, N.A., New York, NY (US)

(72) Inventors: Jacob L. Cox, Littleton, CO (US); August D. Mondale, Aurora, CO (US); Sheridan Wendt, Lakewood, CO (US); Robert S. Newnam, Wilmington, DE (US)

(73) Assignee: JPMORGAN CHASE BANK, N.A., New York, NY (US)

( * ) Notice: Subject to any disclaimer, the term of this patent is extended or adjusted under 35 U.S.C. 154(b) by 515 days.

(21) Appl. No.: 16/841,279

(22) Filed: Apr. 6, 2020

(65) Prior Publication Data
US 2021/0307515 A1 Oct. 7, 2021

(51) Int. Cl.
A47B 91/16 (2006.01)
G05B 19/042 (2006.01)
H05K 5/02 (2006.01)

(52) U.S. Cl.
CPC ............ *A47B 91/16* (2013.01); *G05B 19/042* (2013.01); *H05K 5/0234* (2013.01); *G05B 2219/25252* (2013.01); *G05B 2219/25257* (2013.01); *G05B 2219/25268* (2013.01)

(58) Field of Classification Search
CPC .... A47B 91/16; A47B 91/028; G05B 19/042; G05B 2219/25252; G05B 2219/25257; G05B 2219/25268; G05B 19/0426; H05K 5/0234; H05K 7/1488

USPC ........... 248/188, 188.2, 188.3, 188.4, 188.5, 248/188.8
See application file for complete search history.

(56) References Cited

U.S. PATENT DOCUMENTS

| 1,417,639 | A | * | 5/1922 | Sterner | A47B 91/028 29/897 |
| 4,027,878 | A | * | 6/1977 | Dadbeh | A63D 15/00 473/29 |
| 4,967,994 | A | * | 11/1990 | Rice | F16M 7/00 248/669 |
| 5,292,095 | A | * | 3/1994 | Cattaneo | A47B 91/028 248/188.4 |

(Continued)

FOREIGN PATENT DOCUMENTS

| CA | 3044109 A1 | * | 5/2018 | ............ | A47B 91/02 |
| DE | 102018106141 A1 | * | 9/2018 | ............ | A47B 91/16 |

*Primary Examiner* — Kimberly T Wood
(74) *Attorney, Agent, or Firm* — GREENBERG TRAURIG LLP

(57) ABSTRACT

A system for automated equipment cabinet leveling may include a foot leveling device for each foot of an equipment cabinet, each foot leveling device comprising a drive gear and a worm gear; a motor for each foot leveling device, each motor driving the worm gear of one of the foot leveling devices; a controller controlling the operation of each motor; and a sensor positioned on a portion of the equipment cabinet to be leveled that detects an orientation of the equipment cabinet and provides orientation data to the controller. The foot leveling device may interface with a foot shaft of the cabinet foot by a drive shaft driven by the drive gear, and the controller may drive at least one of motors to level the surface of the equipment cabinet based on the orientation data by extending or retracting at least one of the cabinet feet.

19 Claims, 8 Drawing Sheets

(56) References Cited

U.S. PATENT DOCUMENTS

| | | | | |
|---|---|---|---|---|
| 5,967,472 | A * | 10/1999 | Wilhelmstatter | A47B 91/028 248/188.4 |
| 8,220,760 | B2 * | 7/2012 | Fetzer | D06F 39/125 248/188.4 |
| 11,076,695 | B1 * | 8/2021 | McCloskey | A47B 91/022 |
| 2003/0136887 | A1 * | 7/2003 | Gabriel | D06F 39/125 248/188.2 |
| 2007/0205342 | A1 * | 9/2007 | Gabriel | F16M 7/00 248/188.4 |
| 2009/0270191 | A1 * | 10/2009 | Cartwright | F16M 7/00 473/33 |
| 2016/0345722 | A1 * | 12/2016 | Chen | A47B 9/04 |
| 2017/0314725 | A1 * | 11/2017 | Ozyuksel | F16M 7/00 |
| 2018/0119726 | A1 * | 5/2018 | Weissert | F16L 3/06 |
| 2018/0290834 | A1 * | 10/2018 | Bacallao | B65G 21/12 |
| 2018/0368574 | A1 * | 12/2018 | Cattaneo | A47B 91/028 |

* cited by examiner

US 11,751,687 B2

SYSTEMS AND METHODS FOR AUTOMATED EQUIPMENT CABINET LEVELING

BACKGROUND OF THE INVENTION

1. Field of the Invention

The present disclosure generally relates to systems and methods for automated cabinet leveling.

2. Description of the Related Art

Leveling equipment cabinets in datacenters is time consuming and precise work, and often requires multiple engineers. As data centers move from raised floor designs to poured slabs, variations in the floor surface level are more pronounced, making leveling even more difficult.

The existing process for leveling cabinets is to place a spirit level on a cabinet and manually turn the cabinet's feet to raise or lower that corner of the cabinet. This is typically done with a crescent wrench from underneath the cabinet, or with a hex (or Allen) wrench from within the cabinet. The height of the cabinets are then aligned with a laser line. The spirit level is repeatedly attached and detached, and the process, in some scenarios, can take over an hour.

SUMMARY OF THE INVENTION

Systems and methods for automated equipment cabinet leveling are disclosed. In one embodiment, a system for automated equipment cabinet leveling may include a foot leveling device for each foot of an equipment cabinet comprising a plurality of cabinet feet, each foot leveling device comprising a drive gear and a worm gear; a motor for each foot leveling device, each motor driving the worm gear of one of the foot leveling devices; a controller interfacing with each of the motors and controlling an operation of each motor; and a sensor positioned on a portion of the equipment cabinet to be leveled that detects an orientation of the equipment cabinet and provides orientation data to the controller. The foot leveling device may interface with a foot shaft of the cabinet foot by a drive shaft driven by the drive gear, and the controller may drive at least one of motors to level the surface of the equipment cabinet based on the orientation data by extending or retracting at least one of the cabinet feet.

In one embodiment, the motor may drive the worm gear using a flexi-shaft.

In one embodiment, the motor may be integral with the foot leveling device.

In one embodiment, the motor may be a stepper motor.

In one embodiment, the sensor may include an accelerometer.

In one embodiment, a plurality of sensors may be provided, each of the plurality of sensors sensing orientation data in a different axis.

In one embodiment, the controller may be configured to raise or lower the equipment cabinet uniformly by controlling the motors to extend or retract the cabinet feet simultaneously.

In one embodiment, the system may further include an alignment sensor positioned on the equipment cabinet and configured to receive a reference signal from an alignment device, the alignment sensor providing an alignment signal to the controller. The controller may control the motors to raise or lower the equipment cabinet based on the alignment signal.

In one embodiment, the foot shaft may include a foot shaft interface that receives the drive shaft.

In one embodiment, the controller may include a user interface that receives a command to lower or raise the equipment cabinet.

According to another embodiment, in a controller comprising a computer processor, the controller interfacing with a sensor positioned on a portion of an equipment cabinet to be leveled, the equipment cabinet comprising a plurality of cabinet feet, and controlling a plurality of motors, each motor driving a foot leveling device associated with one of the plurality of a cabinet foot, a method for automated equipment cabinet leveling may include: (1) receiving, from the sensor, orientation data for the equipment cabinet; (2) identifying one of the cabinet feet to extend or retract based on the orientation data to level the portion of the equipment cabinet; and (3) controlling the motor associated with the identified cabinet foot to drive the foot leveling device associated with the identified cabinet foot to extend or retract the identified cabinet foot. The controller controls the motor to extend or retract the at least one identified cabinet foot until the orientation data indicates that the portion of the cabinet is level.

In one embodiment, the sensor may include an accelerometer.

In one embodiment, the sensor may include a plurality of sensors, each sensor detecting an orientation in a different axis.

In one embodiment, the foot leveling device may include a worm gear and a drive gear and interfaces with a foot shaft for the cabinet foot by a drive shaft.

In one embodiment, the motor extends or retracts the identified cabinet foot by driving the worm gear.

In one embodiment, the method may further include controlling the plurality of motors to simultaneously raise or lower the equipment cabinet.

In one embodiment, the controller may control the plurality of motors to simultaneously raise or lower the equipment cabinet until an alignment signal is received from an alignment sensor positioned on the equipment cabinet.

In one embodiment, the alignment sensor may include a photodiode configured to receive an alignment laser.

In one embodiment, the method may further include controlling the motors to retract the plurality of cabinet feet; and controlling the motors to extend the plurality of cabinet feet until the cabinet feet are in contact with a surface. The motors may include stepper motors, and the controller controls the motors to retract the plurality of cabinet feet until a first skip is detected, and the controller controls the motors to extend the plurality of cabinet feet until a second skip is detected.

BRIEF DESCRIPTION OF THE DRAWINGS

In order to facilitate a fuller understanding of the present invention, reference is now made to the attached drawings. The drawings should not be construed as limiting the present invention but are intended only to illustrate different aspects and embodiments.

DETAILED DESCRIPTION OF PREFERRED EMBODIMENTS

Figure 1:
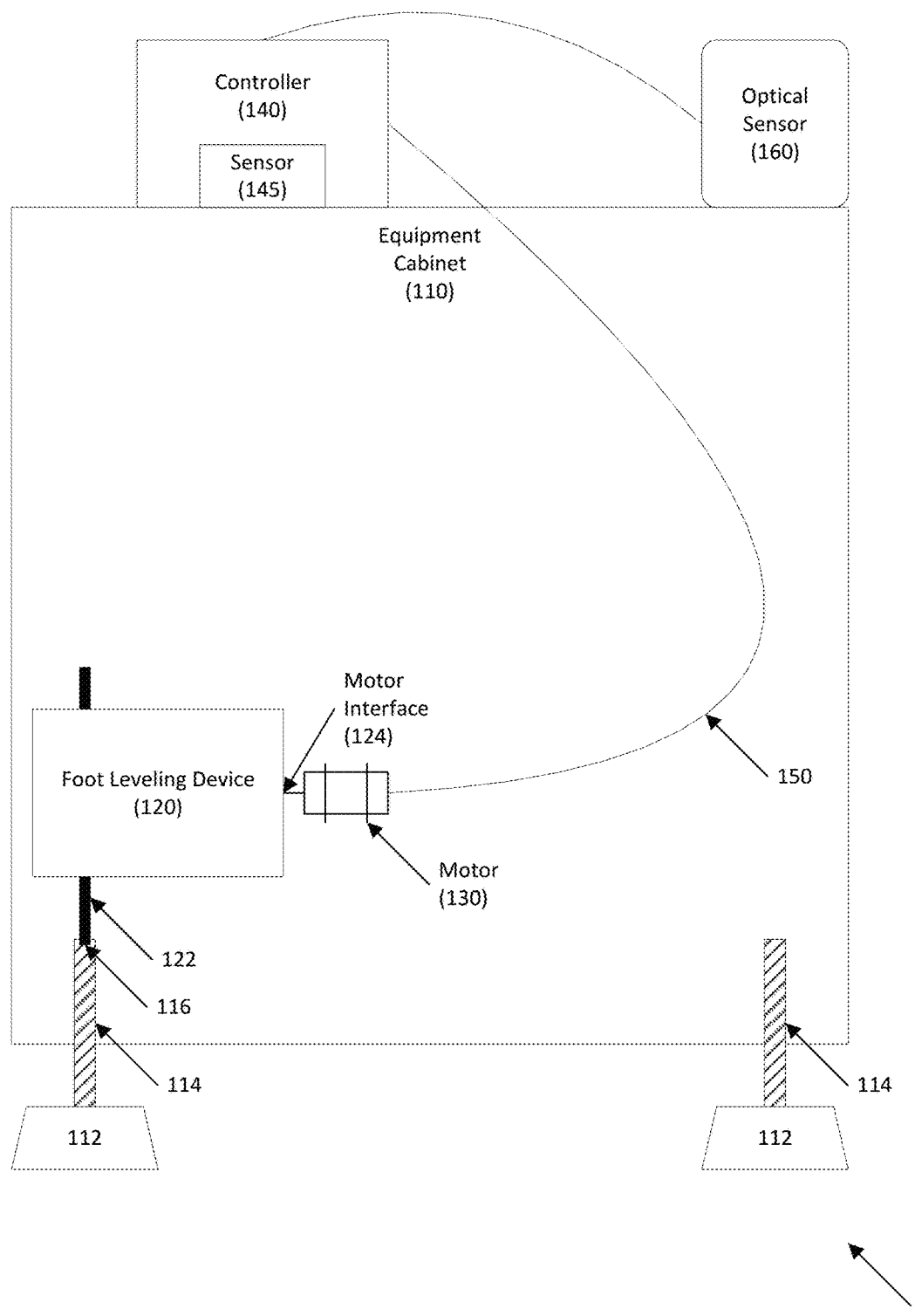
FIG. 1 depicts a system for automated equipment cabinet leveling according to one embodiment.

Embodiments are generally directed to systems and methods for automated equipment cabinet leveling. Embodiments allow a single individual to level a cabinet quickly and precisely.

Embodiments may include a gear set that facilitates an output shaft that slides through an output gear. One gear set may be provided for each cabinet foot, and each gear set may be provided with a drive motor. The drive motors may be in communication with a controller, which may include a level indicating device, such as an accelerometer or similar, that may control each motor individually to raise or lower the respective cabinet foot, thereby adjusting the height of that corner of the equipment cabinet.

In one embodiment, a foot leveling device including the gear set may interface with the cabinet foot from within the equipment cabinet. A drive shaft may be dropped through the top of the foot leveling device, locking the foot leveling device in place. The foot leveling device may include a motor, or may be attached to a motor. A flex-shaft may be attached to the motor and may be connected to a controller, which may measure the level of the cabinet, and may automatically drive the foot leveling device until the cabinet is level.

For example, one or more accelerometer may be attached to, or laid on, a flat surface on the equipment cabinet. In one embodiment, three accelerometers may be used—one for the X-axis, one for the Y-axis, and one for the Z-axis. Measurements may be taken from the accelerometer(s) to obtain a force vector and determine the existing angle of the cabinet. The cabinet feet may be raised or lowered individually until the force vector lies entirely on the Z axis (e.g., 90 degrees).

Upon reaching a level state, the cabinet may be raised or lowered by, for example, activating an up or a down button on the controller. All motors may be driven to raise or lower the height of its respective corner of the equipment cabinet by the same amount. This may be done simultaneously (i.e., all motors are driven at the same time), sequentially (i.e., each motor is driven individually until all are driven), or in any other suitable manner. This may be used align the cabinet with other cabinets.

In embodiments, external sensing devices may be used to align and/or set a height of the equipment cabinet. For example, an external laser may be used to act as a non-physical end stop. One or more sensors (e.g., optical sensors) may be placed on the equipment cabinet in a set of three (e.g., to calculate a plane) or four (e.g., to run in a Boolean fashion). The controller raises the feet until a "collision" (e.g., the sensor senses the laser) is detected with the signal source. If three sensors are used, the controller calculates a plane and adjusted to a true level. If four sensors are used, the controller drives the motors until each sensor detects a "collision" and then stops.

As another example, one or more end stop/limit switches may be positioned on an upper surface of the equipment cabinet. The controller may control the motors to raise the equipment cabinet until the switch is triggered, indicating a collision with something above the cabinet. An exemplary use case is for alignment of an equipment cabinet within rigid, or substantially inflexible, containment systems, such as physical walls, polycarbonate, etc. Embodiments may use a "dead man's switch" to prevent crushing the containment if sensors are misplaced.

Embodiments may use a single sensor to provide feedback for all equipment cabinet feet, or multiple sensors, where each sensor is associated with a single cabinet foot or with multiple cabinet feet. For example, four sensors may have a board placed above them, and as each sensor is activated (each corner strikes the object) the controller may continue to raise the other feet until their related sensor triggers. This may achieve a level with a mating surfaces of the containment.

In another embodiment, one or more distance sensing sensors (e.g., ultrasonic, lidar, etc.) may be placed on an upper surface of the cabinet. For example, a single sensor may be placed in a center of the cabinet, multiple sensors may be provided to control as few or as many cabinet legs, etc. The controller may control the motors to raise the equipment cabinet until the sensor(s) read a set offset from the object the cabinet is referencing. An example use case is a rigid containment with gaskets, or a rigid containment installed after cabinet is level (e.g., allowing for a pre-determined size piece of containment to be prepared).

In another embodiment, a load cell or other sensor, such as a spring-loaded limit switch may be used in addition to, or in lieu of, an accelerometer. For example, the controller may control the motors to raise the equipment cabinet until a pre-defined load amount is reached. One sensor may be used for a single load reading, or multiple sensors may be used for multiple readings (e.g., a left side/right side style reading). In embodiments, a "dead man switch" may be used so that movement only occurs when an operator is actively commanding the movement. An exemplary use case is with a gasket-style containment, where large gaskets, drapes, or other flexible containment options are used that rely upon a strong seal to maintain containment.

Although embodiments are described in the context of an equipment cabinet, it should be recognized that the features disclosed herein may be used with any suitable device that may be leveled and/or raised. In addition, the drive shaft arrangement disclosed herein, in particular, the ability to use multiple gear sets with a single drive shaft, may have applicability in situation where increased torque is desired (e.g., drilling, etc.).

Referring to FIG. 1, a system for automated equipment cabinet leveling is disclosed according to one embodiment. System 100 may include equipment cabinet 110, which may be a cabinet for electrical equipment, such as rack-mounted computer equipment (e.g., servers, switches, etc.). It should be noted that equipment cabinet 110 may hold any sort of suitable equipment, and embodiments are not limited to electrical or computer equipment. For example, the systems and methods described herein may be used to level any piece of equipment that may have adjustable feet.

Cabinet 110 may include a plurality of leveling feet 112, and each leveling foot 112 may include foot shaft 114. In one embodiment, foot shaft 114 may be threaded and may interact with a thread (not shown) in the bottom surface of cabinet 110 to extend or retract therefrom as foot shaft 114 is turned.

At an end opposite foot 112, foot shaft 114 may include a top drive interface 116 to interface with drive shaft 122. Top drive interface 116 may be any suitable drive interface, including hex, square, slotted, etc.

In one embodiment, top drive interface 116 may include a mechanism to remain in contact with drive shaft 122. For example, drive shaft 122 may include spring-loaded detents (not shown) and top drive interface may include recesses or openings (not shown) to receive the spring-loaded detents. In another embodiment, drive shaft 122 and top drive interface 166 may be magnetized with opposite polarities so that they remain in contact. Other suitable mechanisms may be included as is necessary and/or desired.

Foot leveling device 120 may include a gear set (not shown) that may drive drive shaft 122 to drive foot shaft 114 to extend or retract foot 112 from cabinet 110. In one embodiment, the gear set may include a drive gear and a worm gear. The gears will be described in greater detail in FIGS. 2A and 2B, below.

In one embodiment, foot leveling device 120 may be secured to equipment cabinet 110. For example, foot leveling device 120 may be secured using bolds, indexing or retaining pins, a support arm, etc. In one embodiment, two foot leveling devices 120 may be rigidly interconnected.

In another embodiment, two or more foot leveling devices 120 may be provided for the same drive shaft. This may increase the amount of toque provided by drive shaft 122.

Foot leveling device 120 may further include motor interface 124, which may permit motor 130 to interface with the worm gear to drive the drive gear.

In one embodiment, motor 130 may interface with motor interface 124 directly, using a flex-shaft, a straight shaft, etc. Motor 130 may be any suitable motor. In one embodiment, an encoder (not shown) may be used to monitor rotations of motor 130. Alternatively, motor 130 may index to a fixed point on every rotation or power cycle.

In one embodiment, motor 130 may be part of foot leveling device 120. In another embodiment, motor 130 may be a separate element from foot leveling device 120.

Motor 130 may interface with controller 140 using connector 150. Controller 150 may be any suitable controller. Controller 140 may receive data from sensor 145 related to the orientation of equipment cabinet 110. Sensor 145 may be any suitable device that senses whether cabinet 110 is level, such as accelerometers, etc. In one embodiment, motor 130 may be a stepper motor. In one embodiment, the stepper motor may receive different amperage levels from controller 140. For example, controller 140 may provide motor 130 with a low amperage level when retracting or extending cabinet feet 112 so that motor 130 skips or stalls when cabinet feet are fully retracted or are extended to initially make contact with the floor. Controller 140 may then provide a higher amperage level to extend cabinet feet 112 thereby raising equipment cabinet 110. Each motor 130 may count the number of rotations of its cabinet foot 112 to extend cabinet foot 112 by the desired amount.

In one embodiment, sensor 145 may be part of a separate electronic device (not shown), such as a smart phone, that may include one or more accelerometer. The separate electronic device may communicate its sensing(s) to controller 140.

In one embodiment, senor 145 may be part of controller 140. In another embodiment, sensor 145 may be separate from controller 140.

In one embodiment, a sensor 145 may be provided for each axis, such as one for the X-axis, one for the Y-axis, and one for the Z-axis. Any suitable number of sensors 145 may be provided as is necessary and/or desired.

In one embodiment, controller 140 may interface with a plurality of motors 130, such as one motor 130 for each foot 112.

In one embodiment, controller 140 may include a display (not shown) and a user interface (not shown). For example, the display may indicate whether cabinet 110 is level, in which axis it is not level, etc. In one embodiment, the user interface may permit a user to control one or more motor 130 individually, or to raise or lower cabinet 110. The user interface may allow the user to auto-level the cabinet by pressing a single button. The user interface may allow the user to specify a desired height for cabinet 110, and controller 140 may control motors 130 to level and raise or lower cabinet 110 to that height.

In one embodiment, system 100 may include alignment sensor 160 that may receive a reference signal from an alignment device (not shown), such as a laser, a focused light source, etc. Alignment sensor 160 may provide an alignment signal to controller 140, and controller 140 may raise or lower equipment cabinet 110 based on the alignment signal.

In one embodiment, alignment sensor 160 may be an optical sensor (e.g., as a photodiode, a photoresistor, etc., a load cell, spring-loaded limit switch, a stop/limit switch, a distance sensor (e.g., ultrasonic, lidar, etc.) Any suitable alignment sensor 160 that may detect alignment with an external object or reference may be used as is necessary and/or desired.

Figure 2A:
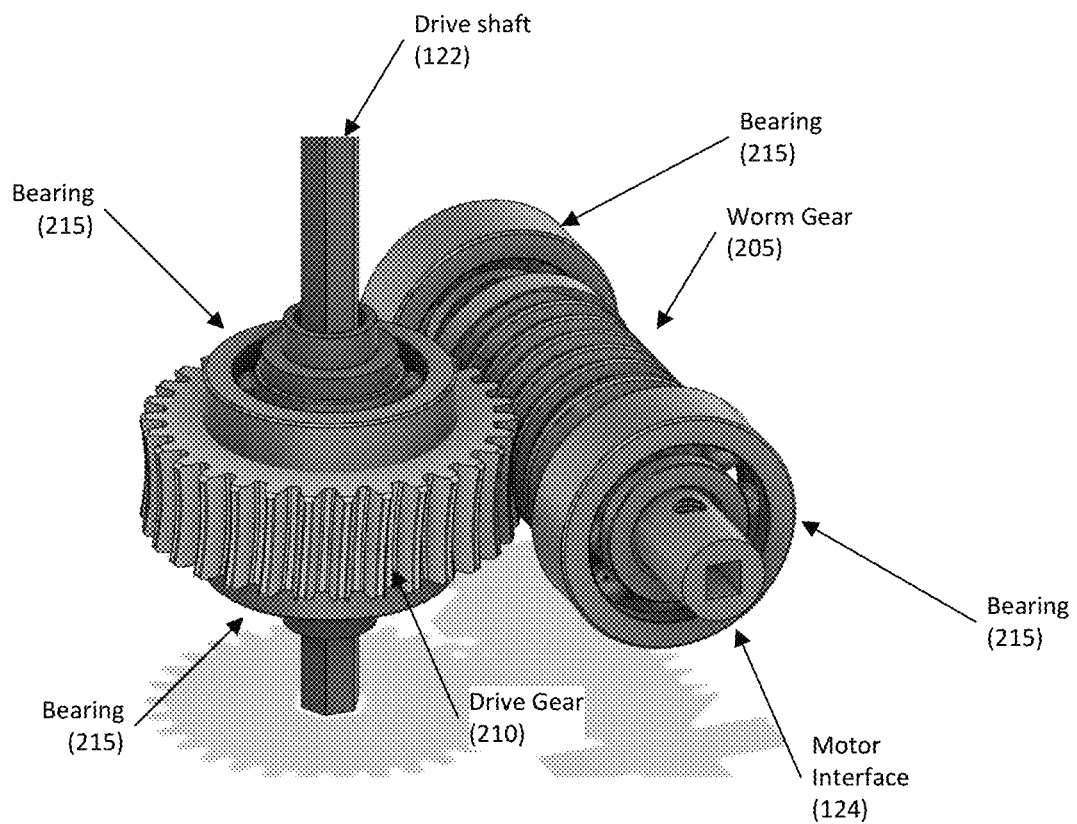
FIG. 2A depicts an illustration of a gear set according to one embodiment.
Figure 2B:
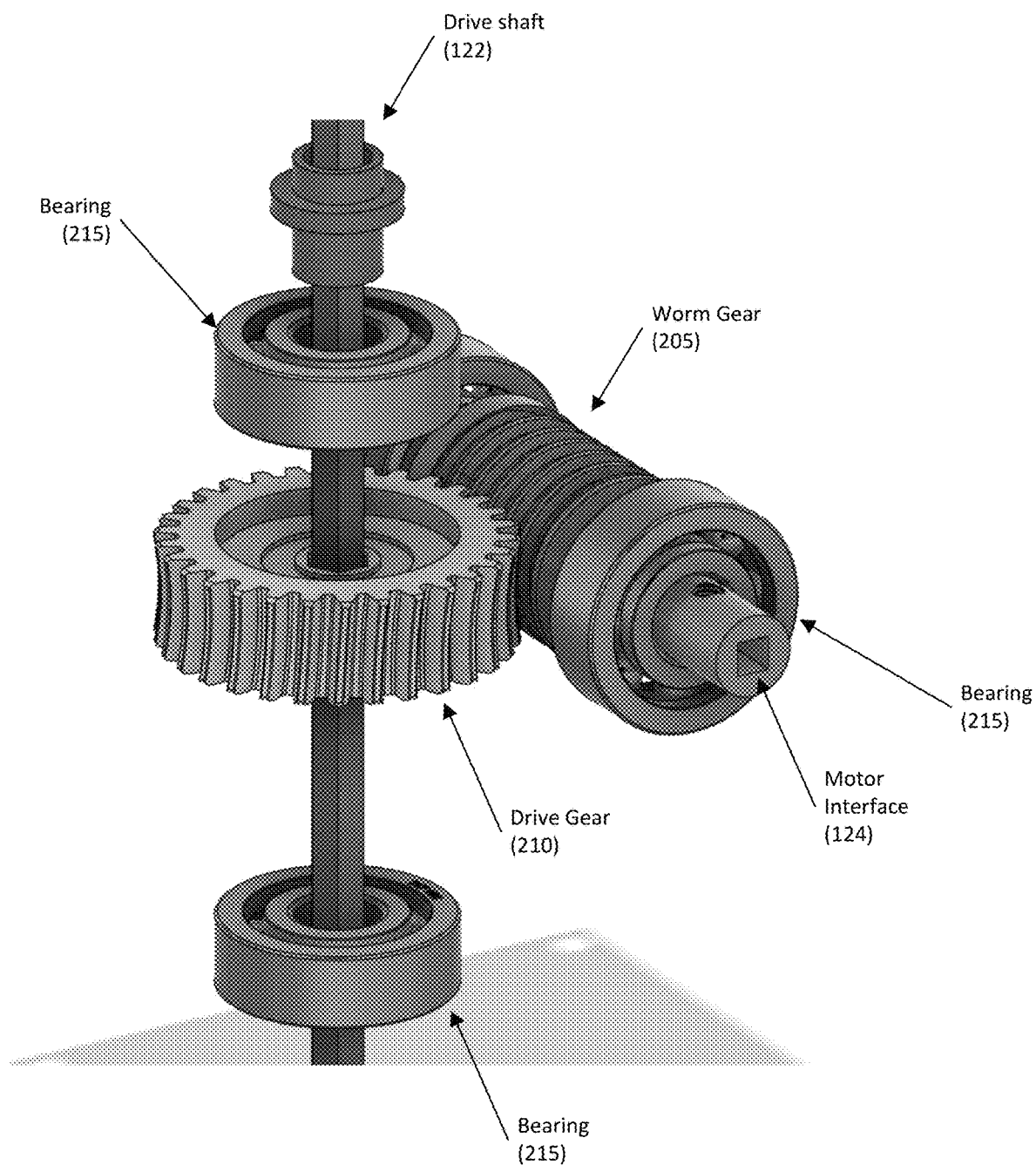
FIG. 2B depicts an expanded view of the gear set of FIG. 2A.

Referring to FIGS. 2A and 2B, an illustration of a gear set is provided according to one embodiment. The gear set may include worm gear 205 and drive gear 210. Worm gear may interface with motor interface 124. Drive shaft 122 may be removeably received by an opening in the center of drive gear 210. As worm gear 205 rotates, it causes drive gear 210 to rotate, thereby driving drive shaft 122.

In one embodiment, bearings 215 may be provided on a top surface and a bottom surface of drive gear 210, as well as at ends of worm gear 205.

Figure 3:
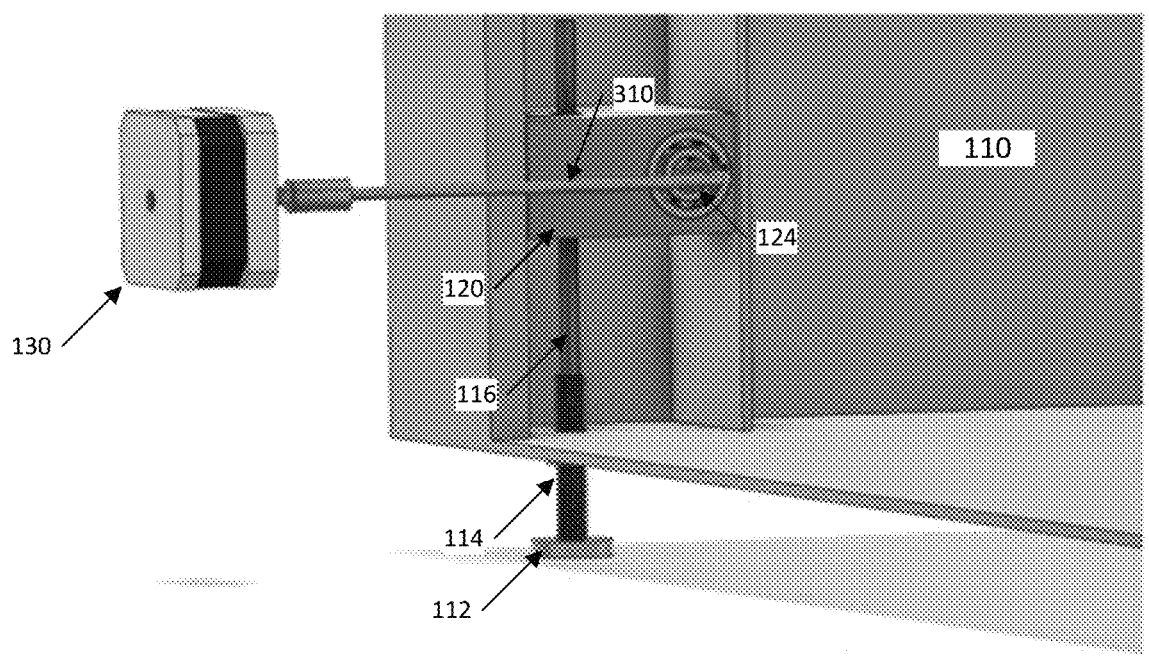
FIG. 3 depicts a system for automated equipment cabinet leveling according to one embodiment.

Referring to FIG. 3, a system for automated equipment cabinet leveling is disclosed according to one embodiment. In FIG. 3, motor 130 interfaces with foot leveling device 120 using shaft 305, which may be a flex-shaft, direct drive, etc.

Figure 4:
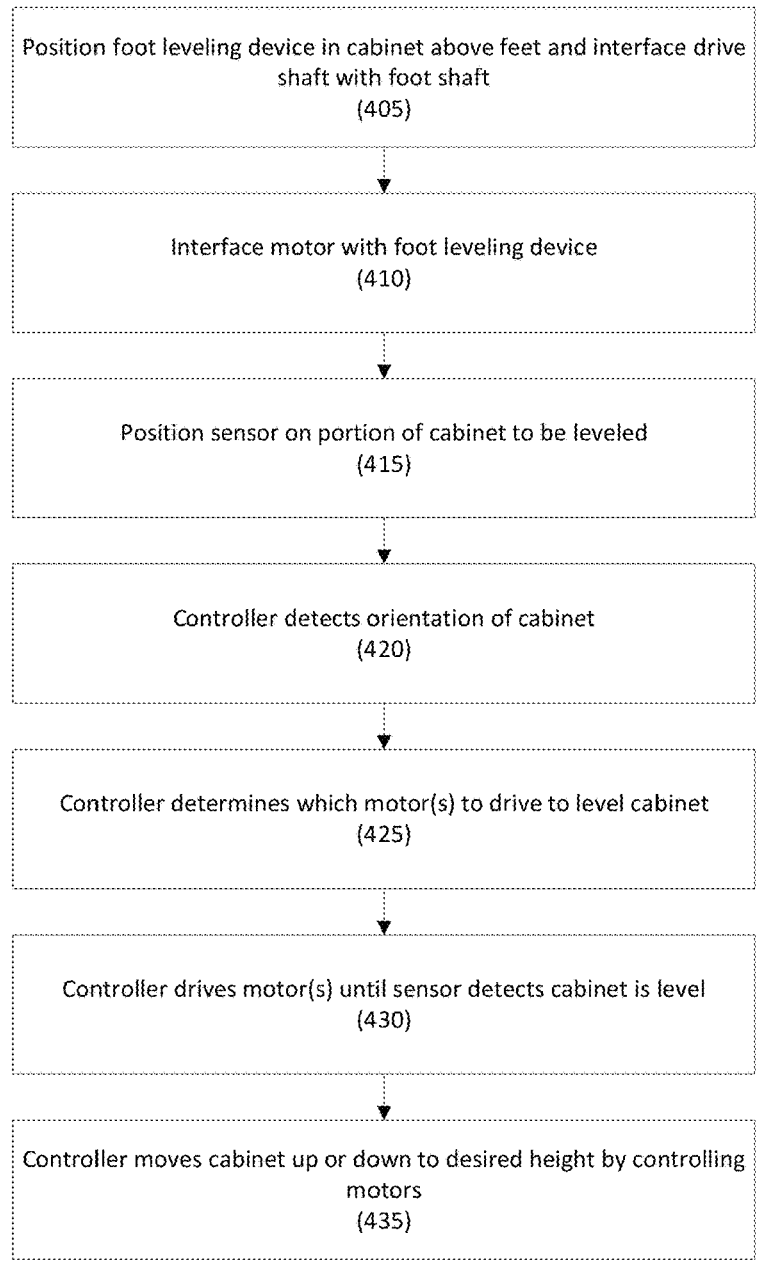
FIG. 4 depicts a method for automated equipment cabinet leveling according to one embodiment.

Referring to FIG. 4, a method for automated equipment cabinet leveling is disclosed according to one embodiment.

In step 405, a foot leveling device may be positioned over each foot of an equipment cabinet. In one embodiment, a foot leveling device may be provided for each foot, and a drive shaft may interface with each foot shaft.

In step 410, if necessary, a motor may interface with each foot leveling device. In one embodiment, a drive shaft, such as a flex-shaft, may be provided to provide the output of the motor to a motor interface of the foot leveling device. Thus, the motor may drive a worm gear of the foot leveling device.

In one embodiment, the foot leveling device may include a motor, so this step is optional.

In step 415, one or more sensor that detects an orientation of a portion of the cabinet to be level may be placed on the portion of the cabinet to be leveled. In one embodiment, the sensor(s) may be placed on a top surface of the cabinet if that top surface is to be leveled.

In one embodiment, a plurality of sensors may be used, such as a sensor for the X-direction, a sensor for the Y-direction, and a sensor for the Z-direction.

In step 420, based on the input from the sensor(s), a controller may detect an orientation of the cabinet, such as a "lean" that the cabinet may have.

In step 425, the controller may determine which motor(s) to drive to level the cabinet. For example, the controller may determine a direction in which the cabinet is leaning, and may drive the motors associated with the feet in the direction of lean to raise that portion of the cabinet. In one embodiment, this may be an iterative process, with the controller making gradual adjustments to each foot until the cabinet is level.

In step 430, the controller may drive the motor(s) until the sensor(s) indicate that the cabinet is level.

In step 435, the controller may raise or lower the cabinet to a desired height. In one embodiment, the user may select an "up" or a "down" button to raise or lower the cabinet. In another embodiment, the user may enter a desired height and the controller may raise or lower the cabinet by that amount by controlling the motors to rotate each foot shaft by a certain number of rotations. Any suitable way of entering a height may be used as is necessary and/or desired.

For example, stepper motors may raise or lower the cabinet with precision. Any suitable way of entering a height may be used as is necessary and/or desired.

In another embodiment, an alignment sensor may be used with an external reference to set the height of the cabinet. For example, an alignment reference device, such as a laser, may emit a reference signal that is received by alignment sensor, and the alignment sensor may provide an alignment signal to the controller to indicate that the cabinet is aligned.

In one embodiment, an optical sensor, such as a photodiode, may be provided for the cabinet and may be used, with a laser in the environment, to set the height of the cabinet.

Figure 5:
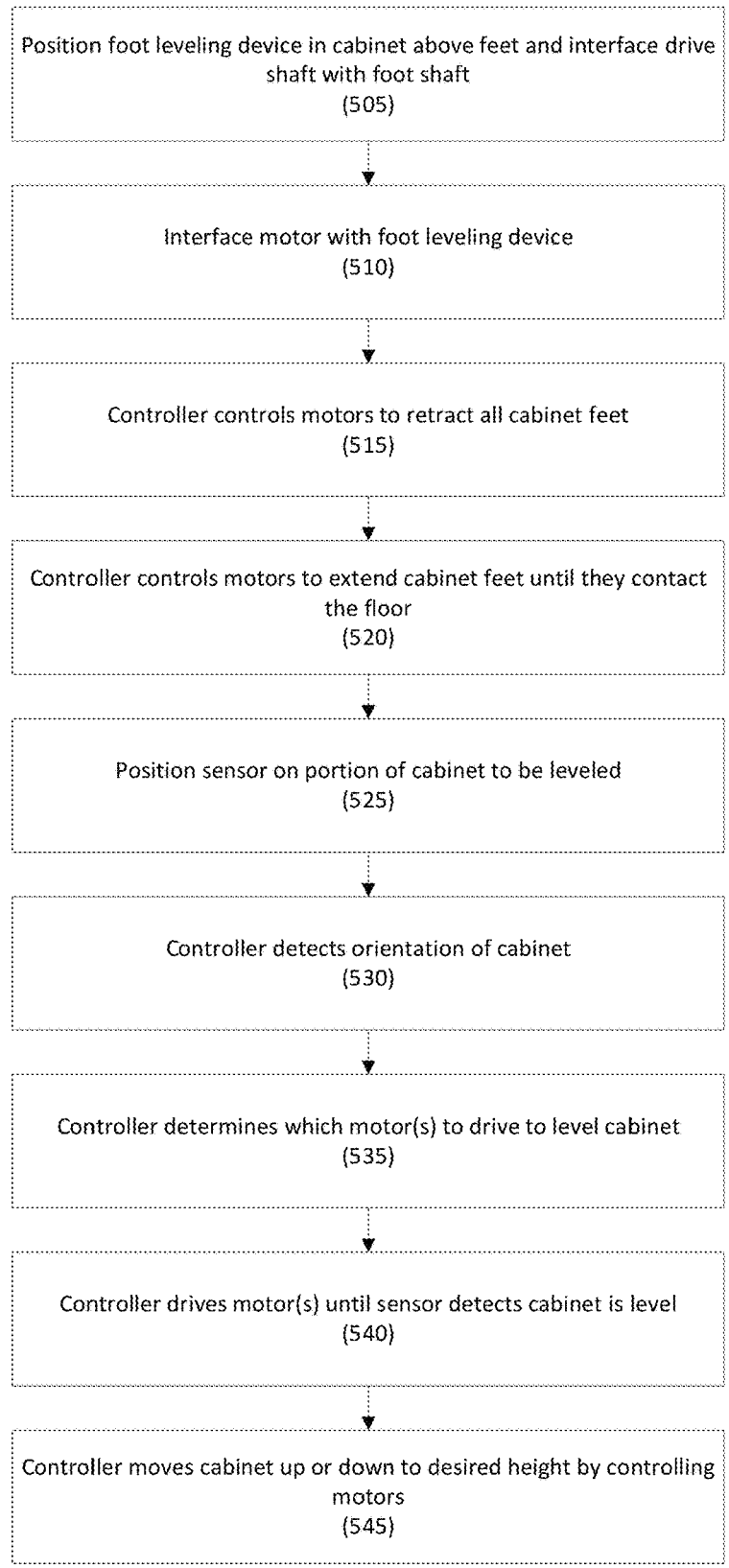
FIG. 5 depicts a method for automated equipment cabinet leveling according to another embodiment.

Referring to FIG. 5, a method for automated equipment cabinet leveling is disclosed according to another embodiment.

In step 505, a foot leveling device may be positioned over each foot of an equipment cabinet. In one embodiment, a foot leveling device may be provided for each foot, and a drive shaft may interface with each foot shaft.

In step 510, if necessary, a motor may interface with each foot leveling device. In one embodiment, a drive shaft, such as a flex-shaft, may be provided to provide the output of the motor to a motor interface of the foot leveling device. Thus, the motor may drive a worm gear of the foot leveling device.

In one embodiment, the foot leveling device may include a motor, so this step is optional.

In step 515, a controller may control the motors to retract all cabinet feet. In one embodiment, the motor may be a stepper motor, and a low amperage may be provided to the stepper motor. When a skip or a stall is detected, indicating resistance, the motor may stop.

In step 520, after all feet are retracted, the controller may control the motors to extend the cabinet feet until they are in contact with the floor. In one embodiment, a low amperage may be provided to the motors, and when a skip or stall is detected, indicating contact with the floor, the motor may stop.

In one embodiment, the controller may control the motors to simultaneously extend the feet, or it may control the motors to extend the feet individually.

In one embodiment, once a skip is detected, indicating that the feet are in contact with the floor, the controller may stop extending the feet. This indicates that the feet are all in contact with the floor.

In step 525, one or more sensor that detects an orientation of a portion of the cabinet to be level may be placed on the portion of the cabinet to be leveled. In one embodiment, the sensor(s) may be placed on a top surface of the cabinet if that top surface is to be leveled.

In one embodiment, a plurality of sensors may be used, such as a sensor for the X-direction, a sensor for the Y-direction, and a sensor for the Z-direction.

In step 530, based on the input from the sensor(s), a controller may detect an orientation of the cabinet, such as a "lean" that the cabinet may have.

In step 535, the controller may determine which motor(s) to drive to level the cabinet. For example, the controller may determine a direction in which the cabinet is leaning, and may drive the motors associated with the feet in the direction of lean to raise that portion of the cabinet. In one embodiment, this may be an iterative process, with the controller making gradual adjustments to each foot until the cabinet is level.

In step 540, the controller may drive the motor(s) until the sensor(s) indicate that the cabinet is level.

In step 545, the controller may raise or lower the cabinet to a desired height. In one embodiment, the user may select an "up" or a "down" button to raise or lower the cabinet. In another embodiment, the user may enter a desired height and the controller may raise or lower the cabinet by that amount by controlling the motors to rotate each foot shaft by a certain number of rotations. For example, stepper motors may raise or lower the cabinet with precision. Any suitable way of entering a height may be used as is necessary and/or desired.

In another embodiment, an optical sensor, such as a photodiode, may be provided for the cabinet and may be used, with a laser in the environment, to set the height of the cabinet. For example, an alignment device, such as a laser, may emit a laser that is received by photodiode, and the photodiode may provide an alignment signal to the controller to indicate that the cabinet is aligned.

Figure 6:
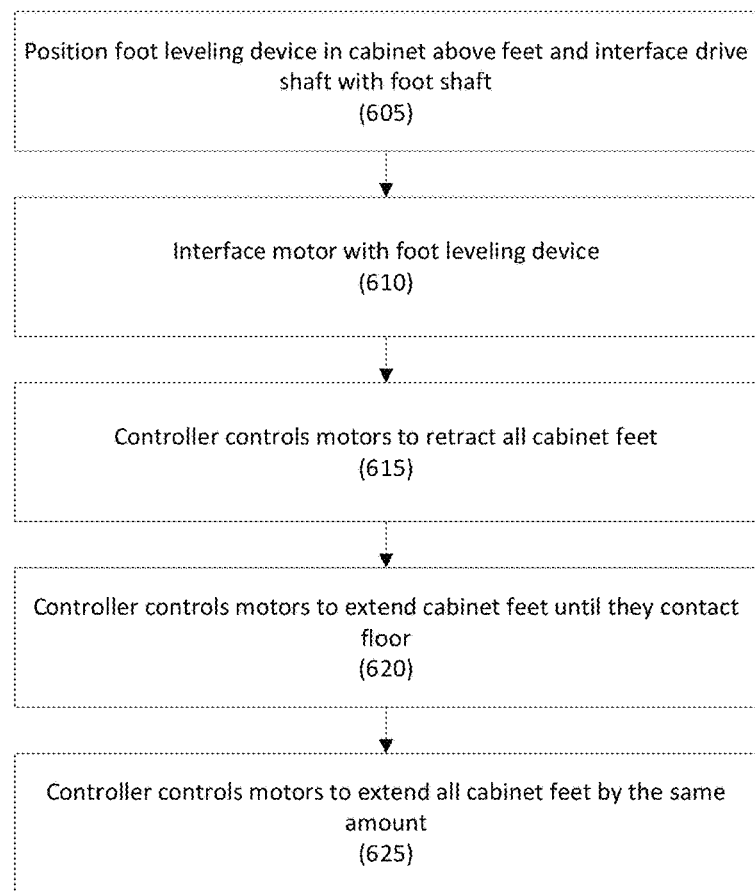
FIG. 6 depicts a method for automated equipment cabinet leveling according to another embodiment.

Referring to FIG. 6, a method for automated equipment cabinet leveling is disclosed according to another embodiment.

In step 605, a foot leveling device may be positioned over each foot of an equipment cabinet. In one embodiment, a foot leveling device may be provided for each foot, and a drive shaft may interface with each foot shaft.

In step 610, if necessary, a motor may interface with each foot leveling device. In one embodiment, a drive shaft, such as a flex-shaft, may be provided to provide the output of the motor to a motor interface of the foot leveling device. Thus, the motor may drive a worm gear of the foot leveling device.

In one embodiment, the foot leveling device may include a motor, so this step is optional.

In step 615, a controller may control the motors to retract all cabinet feet. In one embodiment, the motor may be a stepper motor, and a low amperage may be provided to the stepper motor. When a skip or a stall is detected, indicating resistance, the motor may stop.

In step 620, after all feet are retracted, the controller may control the motors to extend the cabinet feet until they are in contact with the floor. In one embodiment, the controller may control the motors to simultaneously extend the feet, or it may control the motors to extend the feet individually.

In one embodiment, once a skip is detected, indicating that the feet are in contact with the floor, the controller may stop extending the feet. This indicates that the feet are all in contact with the floor.

In step 625, the controller may control each motor to extend the cabinet feet by the same amount, thereby raising the cabinet. In one embodiment, the controller may provide an increased amperage level to the motors so that they do not skip or stall, and the motors may raise the feet by the number of rotations necessary to raise the cabinet by the desired amount.

For example, the controller may control the motor to rotate by a certain number of rotations. An encoder may record or verify the number of steps, or rotations, taken. A stepper motor may be controlled to take individual steps. Other motors may be controlled by controlling a duration of power provided to the motor to achieve the desired number of rotations.

In one embodiment, once the cabinet is automatically raised to the desired height, the height may be manually adjusted using the controller.

Figure 7:
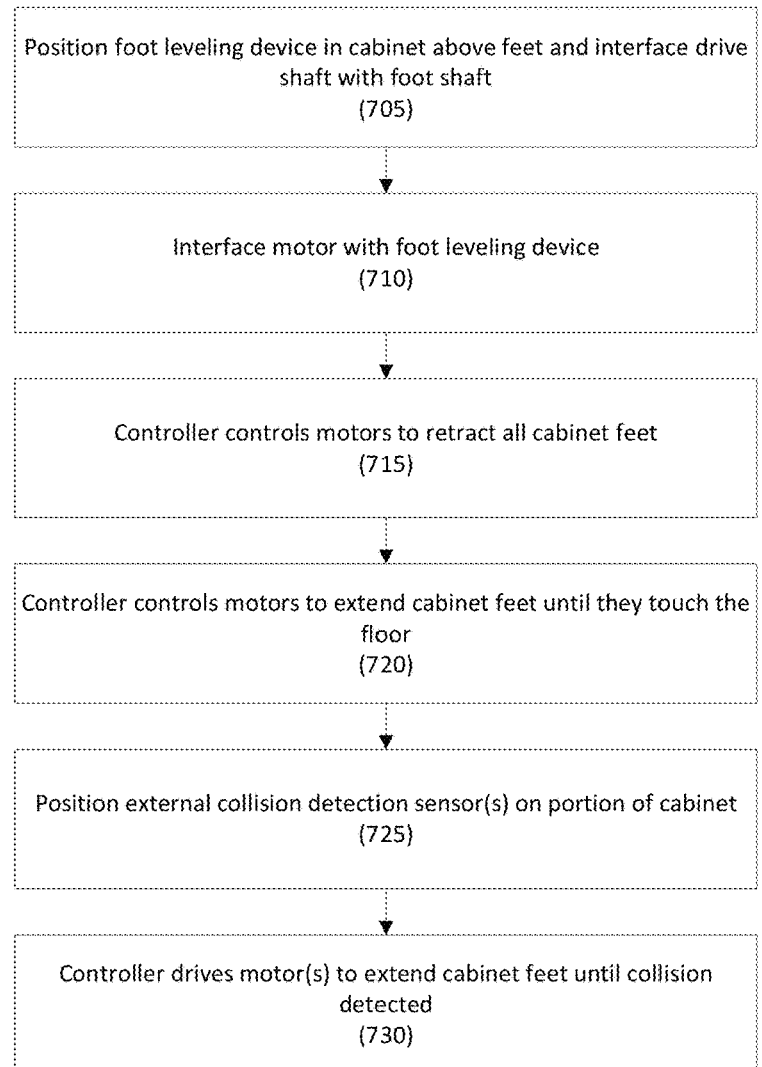
FIG. 7 depicts a method for automated equipment cabinet leveling according to another embodiment.

Referring to FIG. 7, a method for automated equipment cabinet leveling is disclosed according to another embodiment.

In step 705, a foot leveling device may be positioned over each foot of an equipment cabinet. In one embodiment, a foot leveling device may be provided for each foot, and a drive shaft may interface with each foot shaft.

In step 710, if necessary, a motor may interface with each foot leveling device. In one embodiment, a drive shaft, such as a flex-shaft, may be provided to provide the output of the motor to a motor interface of the foot leveling device. Thus, the motor may drive a worm gear of the foot leveling device.

In one embodiment, the foot leveling device may include a motor, so this step is optional.

In step 715, a controller may control the motors to retract all cabinet feet. In one embodiment, the motor may be a stepper motor, and a low amperage may be provided to the stepper motor. When a skip or a stall is detected, indicating resistance, the motor may stop.

In step 720, after all feet are retracted, the controller may control the motors to extend the cabinet feet until they are in contact with the floor. In one embodiment, the controller may control the motors to simultaneously extend the feet, or it may control the motors to extend the feet individually.

In one embodiment, once a skip is detected, indicating that the feet are in contact with the floor, the controller may stop extending the feet. This indicates that the feet are all in contact with the floor.

In one embodiment, steps 715 and 720 may be optional.

In step 725, one or more a sensor, such as an external collision detection sensor, may be provided on the cabinet. Examples include optical sensors (e.g., for detecting a "collision" with an external laser), load cells, limit switches, end stop/limit switches, ultrasonic sensors, lidar sensors, etc. The external collision detection sensor(s) may be positioned as desired (e.g., a single external collision detection sensor centered on the cabinet, multiple external collision detection sensors arranged in a plane, multiple external collision detection sensors, with one associated with each corner of the cabinet, etc.). The external collision detection sensors may interact with the controller by wire, wirelessly, etc.

In step 730, the controller may control each motor to extend the cabinet feet by the same amount until a collision with an external object is detected. For example, the sensor may detect a collision with an external laser, may detect a collision by detecting a limit on a load switch, may detect a collision and an object above it (or reaching a desired distance from the object, thereby triggering a "collision").

In one embodiment, if multiple external collision detection sensors are used, the controller may control each motor individually until each external collision detection sensor detects a collision.

In one embodiment, the controller may be configured to fine tune the height adjustment. For example, the controller may cause the motor to reverse by a certain number of steps until the collision detection sensors are no longer triggered. After all motors have performed this, the controller may control the motors to extend the feet until they experience another collision, and then reverse the motors by fewer steps than previously reversed.

In one embodiment, the controller may control the motors to reverse by a certain amount so that the collision detection sensors can be removed. Once the sensor(s) are removed, the controller may cause the motors to extend the feet by the number of steps reversed, by the number of steps reversed plus a number of steps equal to amount of the height of the sensor, etc. The latter would eliminate the gap between the top of the cabinet and the object.

In one embodiment, once the cabinet is automatically raised to the desired height, the height may be manually adjusted using the controller.

It should be recognized that although several different embodiments are disclosed, these embodiments are not exclusive. Thus, although certain features may be disclosed in the context of one embodiment, the features may be used any embodiment as is necessary and/or desired.

Hereinafter, general aspects of implementation of the systems and methods of the embodiments will be described.

The system of the embodiments or portions of the system of the embodiments may be in the form of a "processing machine," such as a general-purpose computer, for example. As used herein, the term "processing machine" is to be understood to include at least one processor that uses at least one memory. The at least one memory stores a set of instructions. The instructions may be either permanently or temporarily stored in the memory or memories of the processing machine. The processor executes the instructions that are stored in the memory or memories in order to process data. The set of instructions may include various instructions that perform a particular task or tasks, such as those tasks described above. Such a set of instructions for performing a particular task may be characterized as a program, software program, or simply software.

In one embodiment, the processing machine may be a specialized processor.

As noted above, the processing machine executes the instructions that are stored in the memory or memories to process data. This processing of data may be in response to commands by a user or users of the processing machine, in response to previous processing, in response to a request by another processing machine and/or any other input, for example.

As noted above, the processing machine used to implement the embodiments may be a general-purpose computer. However, the processing machine described above may also utilize any of a wide variety of other technologies including a special purpose computer, a computer system including, for example, a microcomputer, mini-computer or mainframe, a programmed microprocessor, a micro-controller, a peripheral integrated circuit element, a CSIC (Customer Specific Integrated Circuit) or ASIC (Application Specific Integrated Circuit) or other integrated circuit, a logic circuit, a digital signal processor, a programmable logic device such as a FPGA, PLD, PLA or PAL, or any other device or arrangement of devices that is capable of implementing the steps of the processes of the embodiments.

The processing machine used to implement the embodiments may utilize a suitable operating system. Thus, embodiments may include a processing machine running the iOS operating system, the OS X operating system, the Android operating system, the Microsoft Windows™ operating systems, the Unix operating system, the Linux operating system, the Xenix operating system, the IBM AIX™ operating system, the Hewlett-Packard UX™ operating system, the Novell Netware™ operating system, the Sun Microsystems Solaris™ operating system, the OS/2™ operating system, the BeOS™ operating system, the Macintosh operating system, the Apache operating system, an OpenStep™ operating system or another operating system or platform.

It is appreciated that in order to practice the methods as described above, it is not necessary that the processors and/or the memories of the processing machine be physically located in the same geographical place. That is, each of the processors and the memories used by the processing machine may be located in geographically distinct locations and connected so as to communicate in any suitable manner. Additionally, it is appreciated that each of the processor and/or the memory may be composed of different physical pieces of equipment. Accordingly, it is not necessary that the processor be one single piece of equipment in one location and that the memory be another single piece of equipment in another location. That is, it is contemplated that the processor may be two pieces of equipment in two different physical locations. The two distinct pieces of equipment may be connected in any suitable manner. Additionally, the memory may include two or more portions of memory in two or more physical locations.

To explain further, processing, as described above, is performed by various components and various memories. However, it is appreciated that the processing performed by two distinct components as described above may, in accordance with a further embodiment, be performed by a single component. Further, the processing performed by one distinct component as described above may be performed by two distinct components. In a similar manner, the memory storage performed by two distinct memory portions as described above may, in accordance with a further embodiment, be performed by a single memory portion. Further, the memory storage performed by one distinct memory portion as described above may be performed by two memory portions.

Further, various technologies may be used to provide communication between the various processors and/or memories, as well as to allow the processors and/or the memories to communicate with any other entity; i.e., so as to obtain further instructions or to access and use remote memory stores, for example. Such technologies used to provide such communication might include a network, the Internet, Intranet, Extranet, LAN, an Ethernet, wireless communication via cell tower or satellite, or any client server system that provides communication, for example. Such communications technologies may use any suitable protocol such as TCP/IP, UDP, or OSI, for example.

As described above, a set of instructions may be used in the processing of the embodiments. The set of instructions may be in the form of a program or software. The software may be in the form of system software or application software, for example. The software might also be in the form of a collection of separate programs, a program module within a larger program, or a portion of a program module, for example. The software used might also include modular programming in the form of object oriented programming. The software tells the processing machine what to do with the data being processed.

Further, it is appreciated that the instructions or set of instructions used in the implementation and operation of the embodiments may be in a suitable form such that the processing machine may read the instructions. For example, the instructions that form a program may be in the form of a suitable programming language, which is converted to machine language or object code to allow the processor or processors to read the instructions. That is, written lines of programming code or source code, in a particular programming language, are converted to machine language using a compiler, assembler or interpreter. The machine language is binary coded machine instructions that are specific to a particular type of processing machine, i.e., to a particular type of computer, for example. The computer understands the machine language.

Any suitable programming language may be used in accordance with the various embodiments. Illustratively, the programming language used may include assembly language, Ada, APL, Basic, C, C++, COBOL, dBase, Forth, Fortran, Java, Modula-2, Pascal, Prolog, REXX, Visual Basic, and/or JavaScript, for example. Further, it is not necessary that a single type of instruction or single programming language be utilized in conjunction with the operation of the system and method of the embodiments. Rather, any number of different programming languages may be utilized as is necessary and/or desirable.

Also, the instructions and/or data used in the practice of the embodiments may utilize any compression or encryption technique or algorithm, as may be desired. An encryption module might be used to encrypt data. Further, files or other data may be decrypted using a suitable decryption module, for example.

As described above, the embodiments may illustratively be embodied in the form of a processing machine, including a computer or computer system, for example, that includes at least one memory. It is to be appreciated that the set of instructions, i.e., the software for example, that enables the computer operating system to perform the operations described above may be contained on any of a wide variety of media or medium, as desired. Further, the data that is processed by the set of instructions might also be contained on any of a wide variety of media or medium. That is, the particular medium, i.e., the memory in the processing machine, utilized to hold the set of instructions and/or the data used in the embodiments may take on any of a variety of physical forms or transmissions, for example. Illustratively, the medium may be in the form of paper, paper transparencies, a compact disk, a DVD, an integrated circuit, a hard disk, a floppy disk, an optical disk, a magnetic tape, a RAM, a ROM, a PROM, an EPROM, a wire, a cable, a fiber, a communications channel, a satellite transmission, a memory card, a SIM card, or other remote transmission, as well as any other medium or source of data that may be read by the processors of the embodiments.

Further, the memory or memories used in the processing machine that implements the embodiments may be in any of a wide variety of forms to allow the memory to hold instructions, data, or other information, as is desired. Thus, the memory might be in the form of a database to hold data. The database might use any desired arrangement of files such as a flat file arrangement or a relational database arrangement, for example.

In the system and method of the embodiments, a variety of "user interfaces" may be utilized to allow a user to interface with the processing machine or machines that are used to implement the embodiments. As used herein, a user interface includes any hardware, software, or combination of hardware and software used by the processing machine that allows a user to interact with the processing machine. A user interface may be in the form of a dialogue screen for example. A user interface may also include any of a mouse, touch screen, keyboard, keypad, voice reader, voice recognizer, dialogue screen, menu box, list, checkbox, toggle switch, a pushbutton or any other device that allows a user to receive information regarding the operation of the processing machine as it processes a set of instructions and/or provides the processing machine with information. Accordingly, the user interface is any device that provides communication between a user and a processing machine. The information provided by the user to the processing machine through the user interface may be in the form of a command, a selection of data, or some other input, for example.

As discussed above, a user interface is utilized by the processing machine that performs a set of instructions such that the processing machine processes data for a user. The user interface is typically used by the processing machine for interacting with a user either to convey information or receive information from the user. However, it should be appreciated that in accordance with some embodiments, it is not necessary that a human user actually interact with a user interface used by the processing machine. Rather, it is also contemplated that the user interface might interact, i.e., convey and receive information, with another processing machine, rather than a human user. Accordingly, the other processing machine might be characterized as a user. Further, it is contemplated that a user interface utilized in the system and method of the embodiments may interact partially with another processing machine or processing machines, while also interacting partially with a human user.

It will be readily understood by those persons skilled in the art that the present embodiments are susceptible to broad utility and application. Many embodiments and adaptations other than those herein described, as well as many variations, modifications and equivalent arrangements, will be apparent from or reasonably suggested by the present embodiments and foregoing description thereof, without departing from the substance or scope of the invention.

Accordingly, while the present exemplary embodiments have been described here in detail, it is to be understood that this disclosure is only illustrative and exemplary and is made to provide an enabling disclosure of the invention. Accordingly, the foregoing disclosure is not intended to be construed or to limit the present embodiments or otherwise to exclude any other such embodiments, adaptations, variations, modifications or equivalent arrangements.

What is claimed is:

1. A system for automated equipment cabinet leveling, comprising:
    a foot leveling device for each foot of an equipment cabinet comprising a plurality of cabinet feet, each foot leveling device comprising a drive gear and a worm gear;
    a motor for each foot leveling device, each motor driving the worm gear of one of the feet leveling devices;
    a controller interfacing with each of the motors and controlling an operation of each motor; and
    a sensor positioned on a portion of the equipment cabinet to be leveled that detects an orientation of the equipment cabinet and provides orientation data to the controller;
    wherein the foot leveling device interfaces with a foot shaft of the cabinet foot by a drive shaft driven by the drive gear;
    wherein the controller:
        drives each of the motors in a first direction to retract the cabinet feet until each of the motors skips or stalls;
        drives each of the motors in a second direction at a first amperage level to extend each of the cabinet feet until each of the motors skips or stalls;
        receives orientation data from the sensor;
        identifies one of the motors to drive to level a surface of the equipment cabinet based on the orientation data; and
        drives the identified motor at a second amperage level that is greater than the first amperage level in the second direction to level the surface of the equipment cabinet by extending the cabinet foot associated with the identified motor, wherein the second amperage prevents the identified motor from skipping or stalling.

2. The system of claim 1, wherein the motor drives the worm gear using a flexi-shaft.

3. The system of claim 1, wherein the motor is integral with the foot leveling device.

4. The system of claim 1, wherein the motor comprises a stepper motor.

5. The system of claim 1, wherein the sensor comprises an accelerometer.

6. The system of claim 1, wherein a plurality of sensors are provided, each of the plurality of sensors sensing orientation data in a different axis.

7. The system of claim 1, wherein the controller is configured to raise or lower the equipment cabinet uniformly by controlling the motors to extend or retract the cabinet feet simultaneously.

8. The system of claim 1, further comprising:
    an alignment sensor positioned on the equipment cabinet and configured to receive a reference signal from an alignment device, the alignment sensor providing an alignment signal to the controller;
    wherein the controller controls the motors to raise or lower the equipment cabinet based on the alignment signal.

9. The system of claim 1, wherein the foot shaft comprises a foot shaft interface that receives the drive shaft.

10. The system of claim 1, wherein the controller comprises a user interface that receives a command to lower or raise the equipment cabinet.

11. A method for automated equipment cabinet leveling, comprising:
    in a controller comprising a computer processor, the controller interfacing with a sensor positioned on a portion of an equipment cabinet to be leveled, the equipment cabinet comprising a plurality of cabinet feet, and controlling a plurality of motors, each motor driving a foot leveling device associated with one of the plurality of a cabinet foot;
    providing a first amperage level to each of the plurality of motors to drive the foot level device associated with each of the plurality of cabinet feet in a first direction to retract the plurality of cabinet feet until each of the plurality of motors skips or stalls;

providing a first amperage level to each of the plurality of motors to drive the foot leveling device associated with each of the plurality of cabinet feet in a second direction to extend each of the cabinet feet;

detecting a skip or a stall by each of the plurality of motors;

receiving, from the sensor, orientation data for the equipment cabinet;

identifying one of the cabinet feet to extend or retract based on the orientation data to level the portion of the equipment cabinet; and providing a second amperage level to the motor associated with the identified cabinet foot to drive the foot leveling device associated with the identified cabinet foot at a second amperage level that is greater than the first amperage level to extend or retract the identified cabinet foot, wherein the second amperage prevents the identified motor from skipping or stalling;

wherein the controller provides the second amperage level to the motor to extend or retract the at least one identified cabinet foot until the orientation data indicates that the portion of the cabinet is level.

12. The method of claim 11, wherein the sensor comprises an accelerometer.

13. The method of claim 11, wherein the sensor comprises a plurality of sensors, each sensor detecting an orientation in a different axis.

14. The method of claim 11, wherein the foot leveling device comprises a worm gear and a drive gear and interfaces with a foot shaft for the cabinet foot by a drive shaft.

15. The method of claim 14, wherein the motor extends or retracts the identified cabinet foot by driving the worm gear.

16. The method of claim 11, further comprising:
controlling the plurality of motors to simultaneously raise or lower the equipment cabinet.

17. The method of claim 16, wherein the controller controls the plurality of motors to simultaneously raise or lower the equipment cabinet until an alignment signal is received from an alignment sensor positioned on the equipment cabinet.

18. The method of claim 17, wherein the alignment sensor comprises a photodiode configured to receive an alignment laser.

19. The method of claim 11, further comprising:
controlling the motors to retract the plurality of cabinet feet; and
controlling the motors to extend the plurality of cabinet feet until the cabinet feet are in contact with a surface.

* * * * *